United States Patent
Fu et al.

(10) Patent No.: US 7,800,451 B2
(45) Date of Patent: Sep. 21, 2010

(54) FREQUENCY ADJUSTMENT FOR CLOCK GENERATOR

(75) Inventors: Zhuo Fu, San Diego, CA (US); Vivek Sarda, Austin, TX (US); Pio Balmelli, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 12/236,042

(22) Filed: Sep. 23, 2008

(65) Prior Publication Data

US 2010/0045395 A1 Feb. 25, 2010

Related U.S. Application Data

(60) Provisional application No. 61/090,369, filed on Aug. 20, 2008.

(51) Int. Cl.
*H03L 7/08* (2006.01)
*H04B 1/69* (2006.01)

(52) U.S. Cl. .................... 331/4; 331/1 A; 327/156; 327/117; 375/130

(58) Field of Classification Search .............. 331/4, 331/16, 23, 1 A, 178; 327/156, 115, 117; 332/100, 117, 123, 127; 377/48, 47; 375/130, 375/132, 135
See application file for complete search history.

(56) References Cited

U.S. PATENT DOCUMENTS 7,042,258 B2 * 5/2006 Booth et al. .............. 327/115
7,181,180 B1 * 2/2007 Teo et al. ................. 455/260
7,417,510 B2 8/2008 Huang
2006/0139102 A1 * 6/2006 Tucholski ................ 331/1 A
2008/0079502 A1 4/2008 Huang

OTHER PUBLICATIONS

Allen, Daniel J. and Carley, Adam L., "Free-Running Ring Frequency Synthesizer," 2006 IEEE International Solid-State Circuits Conference, Feb. 7, 2006, pp. 380-381.
Dai, Fa Foster et al., "A Direct Digital Frequency Synthesizer with Fourth-Order Phase Domain .DELTA..SIGMA. Noise Shaper and 12-bit Current-Steering DAC," IEEE Journal of Solid-State Circuits, vol. 41, No. 4, Apr. 2006, pp. 839-850.
Meninger, Scott E. and Perrott, Michael H., "A 1-MHZ Bandwidth 3.6GHz 0.18-.mu.m CMOS Fractional-N Synthesizer Utilizing a Hybrid PFD/DAC Structure for Reduced Broadband Phase Noise," IEEE Journal of Soild-State Circuits, vol. 41, No. 4, Apr. 2006, pp. 966-980.
Yang, Chin-Yuan et al., "A High-Frequency Phase-Compensation Fractional-N Frequency Synthesizer," IEEE International Symposium on Circuits and Systems, 2005 ISCAS, May 23-26, 2005, pp. 5091-5094.

* cited by examiner

*Primary Examiner*—Robert Pascal
*Assistant Examiner*—Ryan Johnson
(74) *Attorney, Agent, or Firm*—Zagorin O'Brien Graham LLP

(57) ABSTRACT

A fractional-N divider receives an input signal and supplies a divided signal divided in accordance with an integer divide control signal determined from a divide ratio. A phase interpolator is coupled to the fractional-N divider to adjust a phase of the divided signal according to a fractional portion of the divide ratio. The apparatus, responsive to a request for a frequency adjustment of the generated signal in a programmable number of steps, is configured to adjust the frequency of the generated signal from a beginning frequency to an ending frequency in the programmable number of steps by adjusting the supplied divide ratio at each step.

20 Claims, 13 Drawing Sheets

FREQUENCY ADJUSTMENT FOR CLOCK GENERATOR

CROSS-REFERENCE TO RELATED APPLICATION(S)

This application claims benefit under 35 U.S.C. §119(e) of U.S. Provisional Application No. 61/090,369, filed Aug. 20, 2008, entitled "Frequency Adjustment for Clock Generator," and naming as inventors Zhuo Fu, Vivek Sarda, and Pio Balmelli, which application is incorporated by reference herein in its entirety.

BACKGROUND

1. Field of the Invention

This invention relates to clock generators and more particularly to adjusting the frequency of signals generated by the clock generator.

2. Description of the Related Art

A wide variety of electronic products have clock generators or synthesizers to generate the clock signals utilized by the electronic products. A typical clock generator utilizes a phase-locked loop (PLL) supplied with a reference signal from a source such as a crystal oscillator. The output frequency of the signal supplied by the clock generator or synthesizer can be determined by a divider value of the feedback divider in the PLL. Thus, a reference frequency supplied to the PLL is "multiplied" based on the divider value to generate the synthesized clock frequency.

Several types of divider circuits have been utilized in PLLs. One kind of divider is the integer-N divider in which the input signal is divided by an integer number. For example, FIG. 1A illustrates the timing diagram of several integer divides including a divide-by-two, a divide-by-three and a divide-by-four. The signal being divided is CLKin. Note that no jitter is introduced in the frequency division process, other than noise from circuit non-idealities. FIG. 1B illustrates the simple integer divide-by-two provided by a D flip-flop (DFF) 151.

Another type of PLL architecture uses a fractional-N divider. FIG. 1C illustrates a timing diagram of fractional-N frequency division. Fractional-N frequency division allows use of a non-integer divisor by changing the integer divide value according to the fractional portion of the divisor. That is, a stream of integer divides are performed that approximate the desired ratio. For example, FIG. 1C illustrates a timing diagram of a divide-by-2.25. The input clock (CLKin) is shown as waveform 101 having a period of one unit interval (UI). The output of the fractional-N divider is shown in waveform 103. As shown in waveform 103, the divide-by-2.25 is achieved by a sequence of divide-by-two for three periods and a divide-by-three for one period, assuming a first order delta sigma modulator is used to control the fractional-N divider. Waveform 105 illustrates the ideal waveform for a divide-by-2.25. The quantization noise of the modulator, at the output of the fractional-N divider is shown as the difference at 107, 109, and 111, between the actual output of the fractional-N divider shown in waveform 103 and the ideal output for a divide-by-2.25 shown in waveform 105.

One technique for supplying control signals to a fractional-N divider is to use a delta-sigma modulator to supply a divide sequence to the fractional-N feedback divider. The fractional-N divider receives a divide value sequence corresponding to a desired divider value. The fractional-N divider supplies the divided signal to a phase detector with noise associated with the nature of the fractional-N divider. In fractional-N clock synthesis, the fractional-N noise may be filtered out by the PLL loop. In addition, phase error correction may be utilized to address the jitter introduced by the divider by introducing an offset into the PLL corresponding to the jitter generated by the fractional-N divider.

However, the clock synthesizers described above may have limited frequency coverage (integer dividers) and/or require a complex loop filter and complex VCO control that increase the cost in design effort and chip area, resulting in more expensive products that may be too expensive in cost or real estate for significant portions of the clock synthesizer market and/or lack flexibility in operation.

SUMMARY

Accordingly, in one embodiment an apparatus includes a fractional-N divider configured to receive an input signal and supply a divided signal divided in accordance with an integer divide control signal based on a supplied divide ratio. A phase interpolator is coupled to the fractional-N divider to adjust a phase of the divided signal according to a fractional portion of the supplied divide ratio and to supply a generated signal. The apparatus, responsive to a request for a frequency adjustment of the generated signal in a programmable number of steps, is configured to adjust the frequency of the generated signal from a beginning frequency to an ending frequency in the programmable number of steps by adjusting the supplied divide ratio at each step.

In another embodiment, a method is provided for adjusting a frequency of a generated signal. In response to a request to adjust a frequency of the generated signal in a programmable number of steps, the frequency is adjusted from a beginning frequency to an ending frequency in the number of steps. In an embodiment, the frequency is adjusted in substantially equal increments or decrements over the number of steps. In order to provide for adjustment of frequency in substantially equal increments or decrements, in an embodiment, the divide ratio is modified at each step to maintain the calculated frequency increment or decrement substantially the same for each step.

BRIEF DESCRIPTION OF THE DRAWINGS

The present invention may be better understood, and its numerous objects, features, and advantages made apparent to those skilled in the art by referencing the accompanying drawings.

Note that the use of the same reference symbols in different drawings indicates similar or identical items.

DESCRIPTION OF THE PREFERRED EMBODIMENT(S)

Figure 1A:
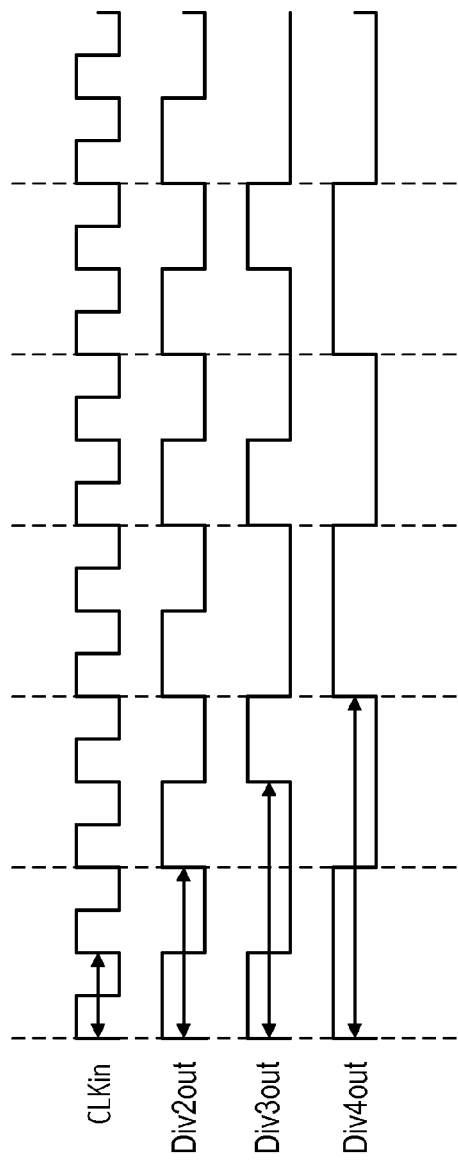
FIG. 1A illustrates integer frequency division.
Figure 1B:
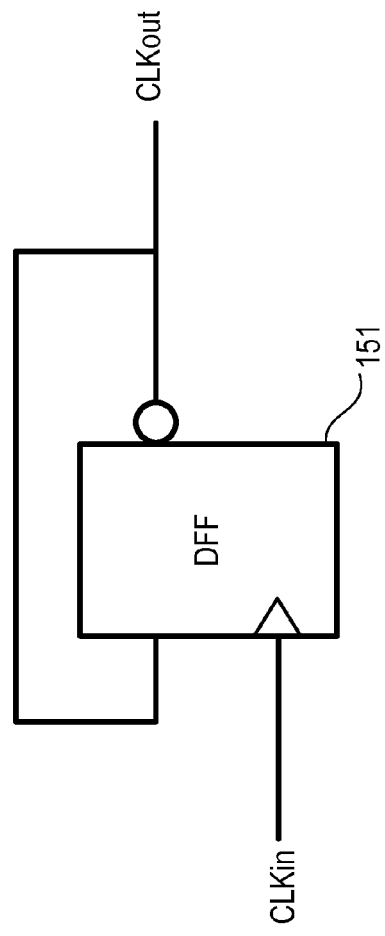
FIG. 1B illustrates a circuit providing a simple divide circuit to provide a divide-by-two division.
Figure 1C:
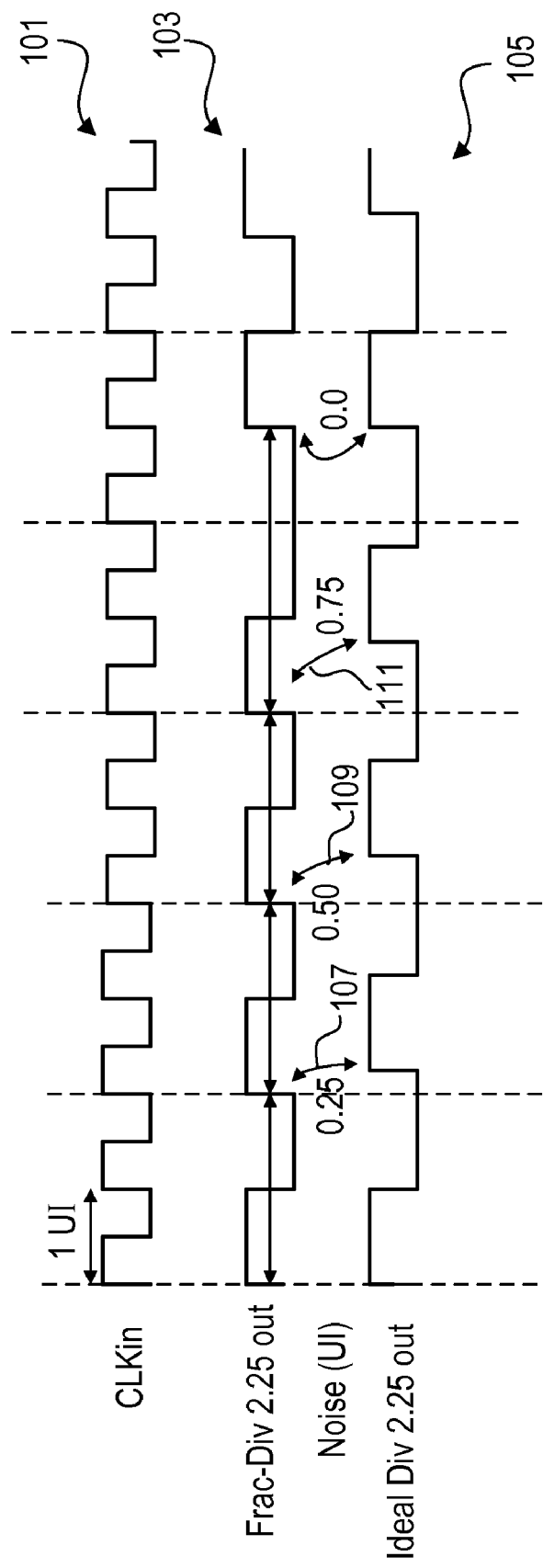
FIG. 1C illustrates a timing diagram of an exemplary fractional-N frequency division operation.
Figure 2:
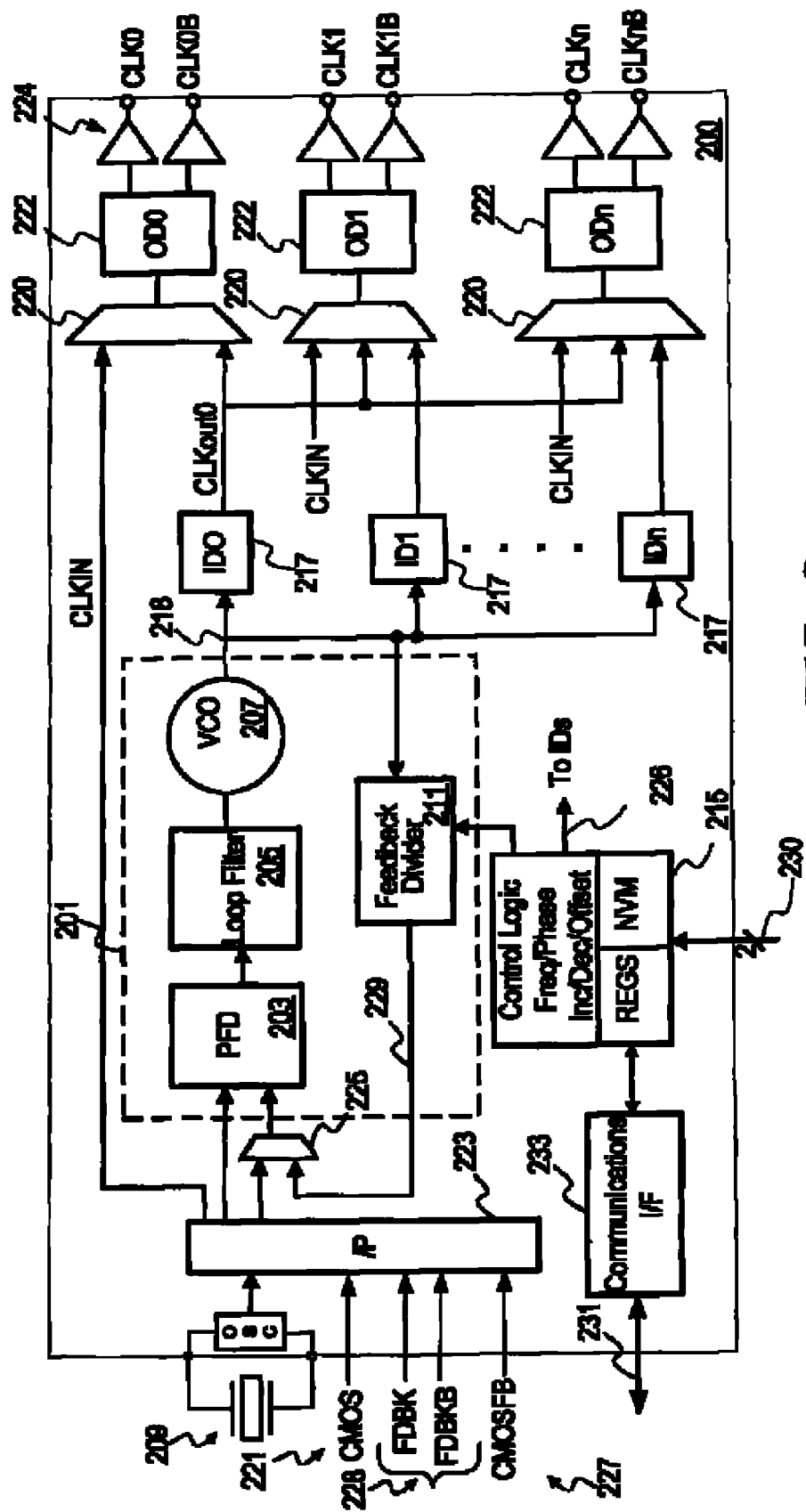
FIG. 2 illustrates an embodiment of an interpolative clock synthesizer incorporating multiple interpolative dividers to generate multiple independent outputs, which may utilize one or more embodiments of the invention.

FIG. 2 illustrates an exemplary architecture of an interpolative clock synthesizer 200 that may utilize various embodiments of the invention(s) described herein. The architecture includes a PLL 201 that includes a phase/frequency detector (PFD) 203, a loop filter 205, and a voltage controlled oscillator (VCO) 207. The loop filter may be implemented as a digital loop filter to avoid the necessity of off-chip capacitors. The VCO may be implemented as a ring oscillator or as an LC oscillator. Other oscillator structures may also be utilized. The PFD 203 receives a reference clock signal, which can come from various sources, such as a fixed source 209, which may be a crystal oscillator or micro electro mechanical structure (MEMS) oscillator, or other sources 221. The block 223 functions as a selector circuit to provide the appropriate reference to PFD 203 and a divider. In addition, a multiplexer circuit 225 functions to select between an internal feedback signal 229 and an external feedback signal provided by block 223. The differential feedback clock inputs FDBK and FDBKB 228 provide feedback clock inputs for use in zero delay buffer (ZDB) mode. The CMOS clock input 221 provides a clock input when a CMOS single-ended clock signal is used as the reference clock. The CMOSFB clock input provides a CMOS level feedback clock input for use in zero delay buffer (ZDB) mode. Block 223 may also function as a divider to divide the received signal.

The PLL 201 also includes a feedback divider 211. In an embodiment, a control logic 215 supplies a divide ratio to the feedback divider 211. The control logic may include non-volatile memory (NVM), state machines, programmable registers and other control structures. In addition, the clock synthesizer 200 may include one or more interpolative dividers 217 that receive the VCO output signal 218. Note that divider 211 may also be implemented as an interpolative divider. In an embodiment, the dividers 217 supply the output drivers 224 through selector circuit 220 and output dividers 222. The interpolative dividers (IDs) 217 receive divide ratios 226 from the control logic 215.

Figure 3:
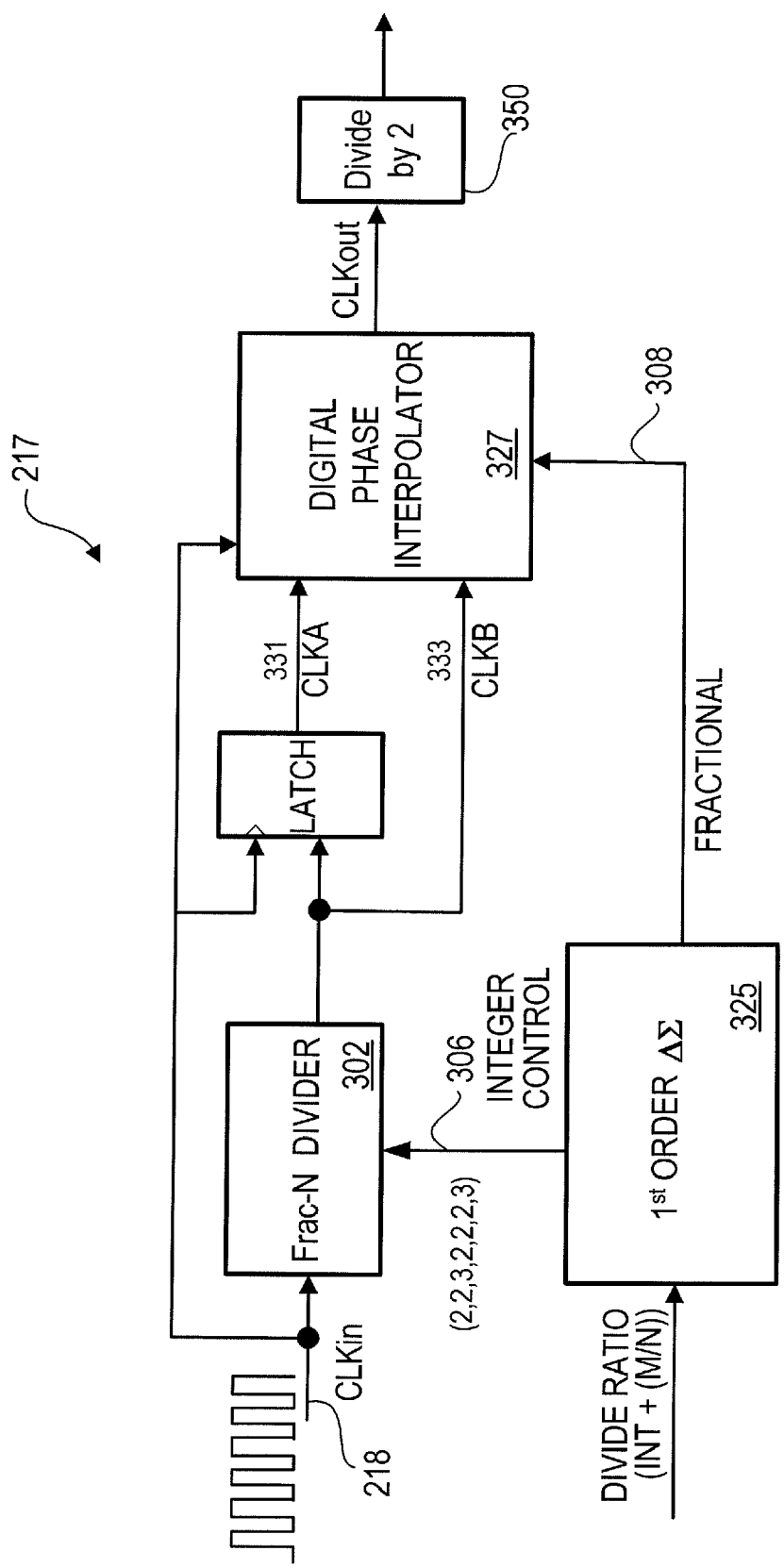
FIG. 3 illustrates an embodiment of an interpolative divider that may be utilized in one or more embodiments of the invention including the interpolative dividers of FIG. 2.

Referring to FIG. 3, an exemplary interpolative divider 217 is illustrated. The interpolative divider 217 includes a fractional-N divider 302 providing multi-modulus dividing capability, which receives input clock 218. In an embodiment the input clock is VCO clock 218 but other embodiments may use a different clock source such a crystal oscillator, micro electro mechanical structure (MEMS) oscillator, or any other clock source. A first order delta sigma modulator 325 receives the divide ratio that includes an integer portion (INT) and a fractional portion (M/N) where M and N are integers and M<N. Note that the divide ratio may be received with the integer portion incorporated into the fraction, i.e., M>N. The divide ratio may be stored by the non-volatile memory or other memory location. For example, a communications interface 233 (see FIG. 2) may provide the divide ratio to a programmable register. The fractional-N divider 302 receives divide control signal 306, which is a stream of integer divide values to approximate the actual divide ratio. For example, as shown in FIG. 3, for a divide-by-2⅓, the divider 302 receives a sequence of (2, 2, 3, 2, 2, 3) over control line 306. The digital quantization error, corresponding to the fractional portion of the divide ratio, is supplied to the digitally controlled phase interpolator 327. The jitter introduced by the fractional-N divider 302 is canceled by interpolation between CLKA 331 and CLKB 333 in phase interpolator 327 based on the digital quantization error supplied by the delta sigma modulator 325. Thus, the VCO clock 218 is divided down by the divider 302 according to the control information provided by the delta sigma modulator 325. The phase interpolator 327 is used to cancel the quantization errors in the output of the fractional-N divider 302. Additional information on clock synthesis using phase interpolation can be found in U.S. patent application Ser. No. 11/550,0223, filed Oct. 17, 2006, naming Yunteng Huang as an inventor, and entitled "Direct Digital Interpretive Synthesis," Publication No. US 2008/079502, published Apr. 3, 2008, which application is incorporated by reference herein in its entirety.

Figure 4:
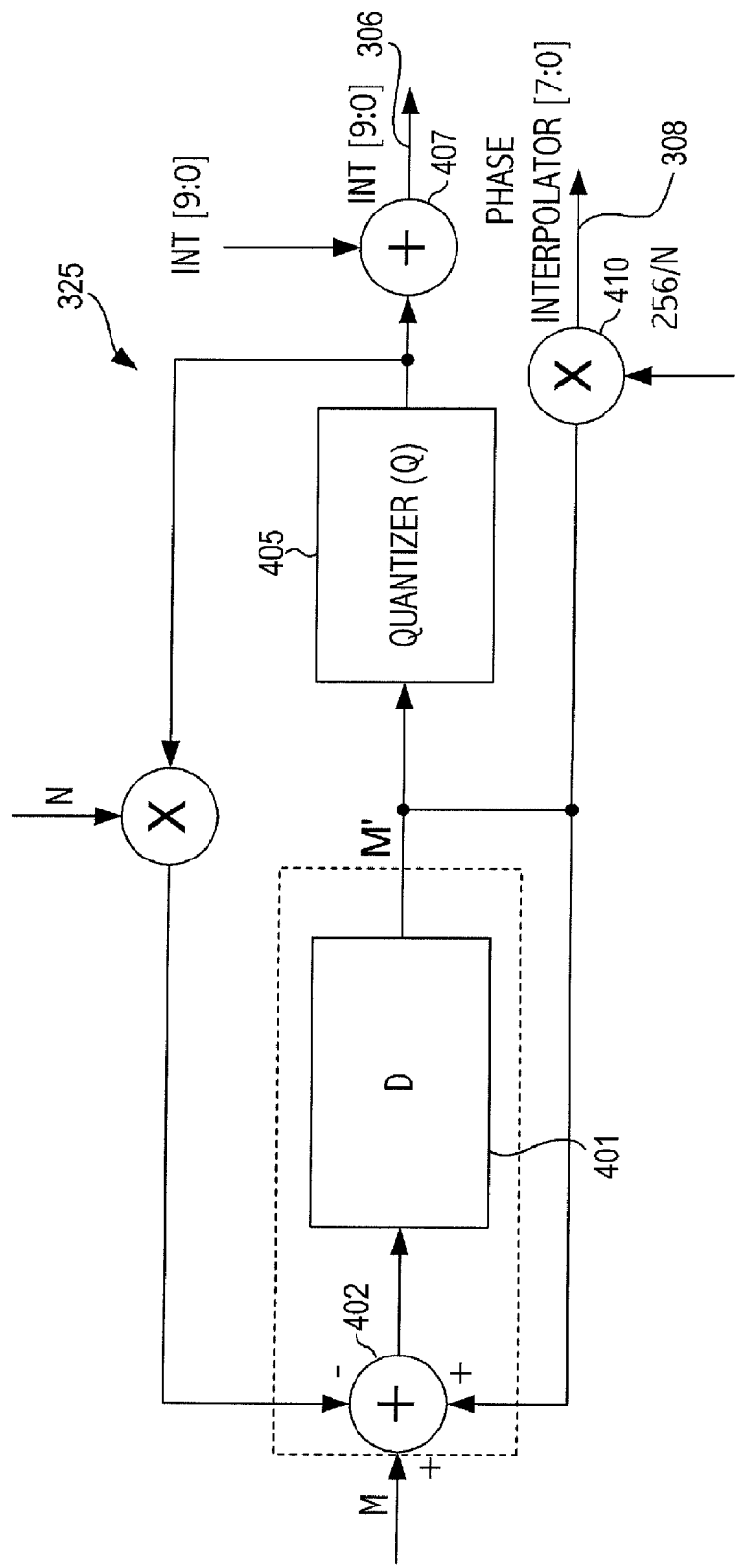
FIG. 4 illustrates a high level diagram of an embodiment of a delta sigma modulator that may be utilized in the interpolative divider of FIG. 3.

Referring to FIG. 4, one approach to generating the appropriate integer divide control signal and the digital quantization error signal, corresponding to the fractional portion of the divide ratio, is shown. Conceptually, the input clock frequency is being divided by (Int+M/N) where Int, M, and N are integers and M<N. The appropriate clock phase is computed by accumulating the fractional period of the input clock using the delta sigma modulator 325. The accumulator includes storage element (D) 401 and summer 402. The quantizer (Q) 405 generates QOUT=1 when Qin>=N, else QOUT=0. The summing circuit 402 subtracts N, whenever QOUT=1. Summing circuit 407 increases the divider control signal 306 by one whenever the accumulated phase error is greater than a period of the input clock. Thus, for a divide-by-2⅓, the sequence for integer control signal 306 is (2, 2, 3, 2, 2, 3). In order for the phase interpolator to properly interpolate to adjust the clock signal generated by divider 302 (see FIG. 3), the phase error supplied on control line 308 to the phase interpolator is quantized, e.g., to 256 levels of a period of the input clock, i.e., mod((M'/N)×256, 256), where M' is the output of the accumulator, and where mod is modulo operator. In an exemplary embodiment, the input clock is 2.5 GHz, so each level represents approximately 1.56 picoseconds.

In FIG. 4, the quantization value is generated in multiplier 410. Alternatively, the quantization can be thought of as a divide, i.e., the accumulated value of M times 256 divided by N. That multiplication (or division) operation is expensive in silicon area and should be performed every output clock cycle, or edge, according to the particular embodiment, in order to properly adjust the clock signal generated by the integer division. Having to quantize the phase error every clock cycle to 256 levels of the input clock period means the operation is also expensive in terms of power consumption.

Figure 5:
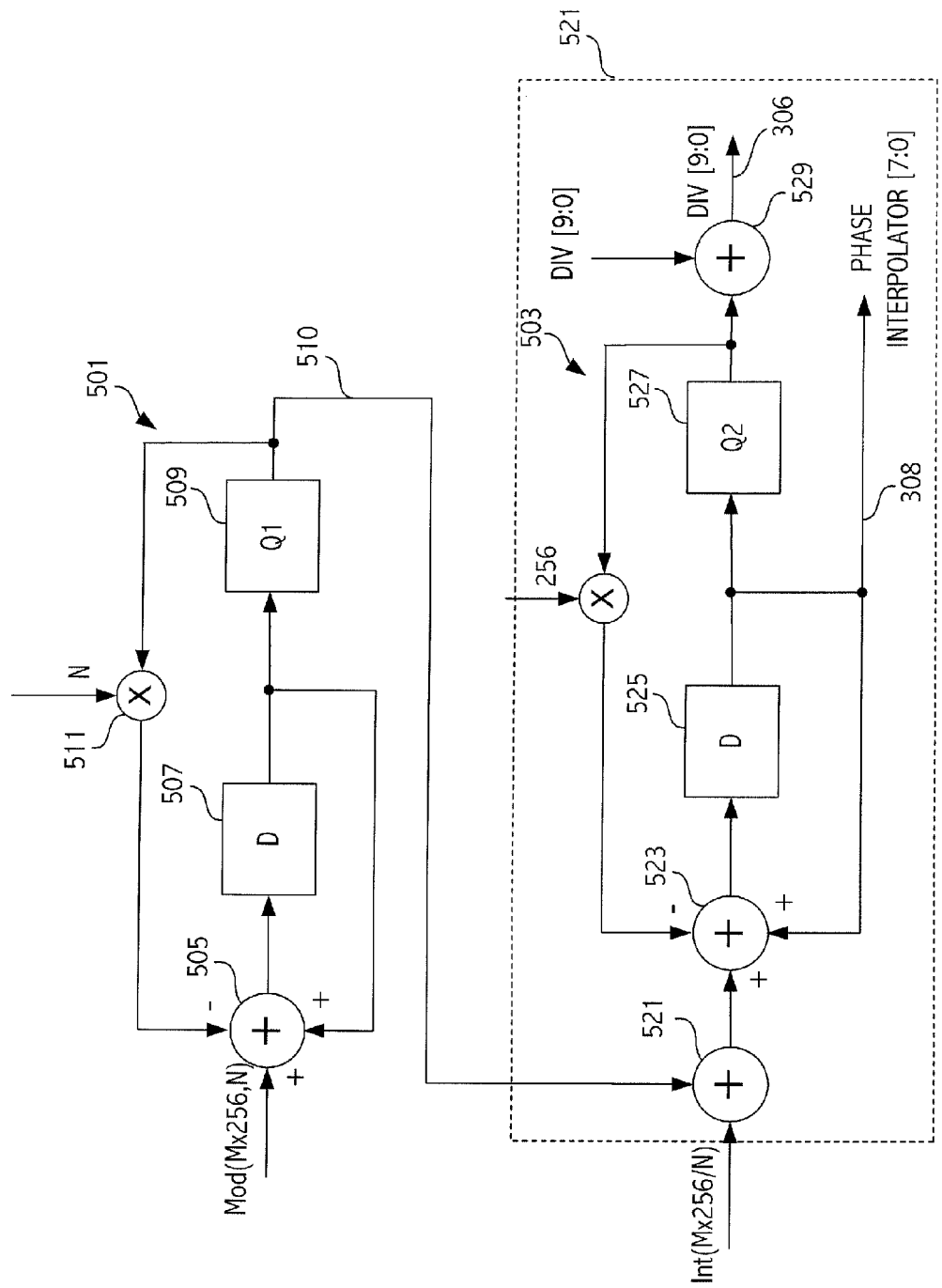
FIG. 5 illustrates an embodiment in which two first order delta sigma modulators are used to generate the fractional-N divider control signal and the phase interpolator control signal.

An alternative approach to the quantization of the phase error for use by the phase interpolator is shown in FIG. 5. The alternative approach reduces the cost of the quantization of the fractional phase error to 256 levels by eliminating the division and multiplication operations. Instead, two delta sigma modulators 501 and 503 are used. An error is associated with the quantization of the phase error to 256 levels. The first DSM 501 accumulates that quantization error. The second DSM 503 accumulates the quantized phase error, i.e., the quantized fractional portion of the divisor. DSM 501 receives Mod(M×256,N). For example, assume the divisor is 5⅔ (M=2 and N=3). Mod(M×256,N)=2. Thus, the accumulator, utilizing summing circuit 505 and storage element 507, accumulates the fractional portion of the quantization error associated with quantization of the phase error. The operation of the quantizer (Q1) 509 is defined as: Qin>=0, Qout=1; else, Qout=0. Of course, a different number of quantization levels other than 256 may be utilized according to the specific needs of the system.

The second DSM 503 supplies the quantized fractional portion of the divisor on 308 as the phase interpolation value and determines when the integer control value supplied on 306 should be increased by one. Assuming that the divisor is 5⅔, summing circuit 521 receives the integer value of Int(M× 256/N). Assuming a phase increment M/N=⅔, and quantization of the phase increment to 256 levels, summing circuit 521 receives a phase increment of 170. The phase increment is the fractional portion of the divisor that accumulates. Summing circuit 521 also sums the quantization error term from delta sigma modulator (DSM) 501 supplied on signal line 510. Summing circuit 521 supplies its sum to summing circuit 523. Summing circuit 523 adds the accumulated quantization term fed back from memory element 525 and subtracts 256 whenever the quantization value supplied by quantizer Q2 equals 1. Quantizer Q2 427 operates as follows: if Qin>=256, then Qout=1; else, Qout=0. When the accumulated value is >=256, and Q2 outputs a 1, the integer control value 306 is incremented by one in summer 529 and a value of 256 is fed back to summer 523 to be subtracted from the accumulated value. Note that the integer divide control value is either integer (e.g., 5 when the divisor is 5⅓) or (integer+1). Note that the proportion of (integer+1) to integer being supplied as the integer divide control value is M/N.

In the embodiment shown in FIG. 5, the lower eight bits of the accumulated value is sent as the fractional part of the divisor for use by the phase interpolator on signal line 308. That is, if the accumulator value is greater than 256, only the fractional part is sent to the interpolator. Note that a reference to a signal line herein may be to a single line or plural physical lines depending on the context.

Various additional aspects and embodiments related to determining the control values for the divider and phase interpolator can be found in U.S. patent application Ser. No. 11/763,060, filed Jun. 14, 2007, entitled "Fractional Divider," naming Zhuo Fu et al. as inventors, which application is incorporated herein by reference in its entirety.

Now that the operation of the interpolative dividers has been described, in an embodiment, the frequency supplied by any or all of the interpolative dividers 217 can be adjusted by incrementing or decrementing the frequency according to one or more control signals received by the integrated circuit 200 and/or according to commands received by the communications interface 233. Referring back to FIG. 2, a serial communication capability is provided over serial clock and data communication lines 231, which supply the communications interface 233. The communications interface is coupled to control logic 215. In an embodiment, the control logic includes nonvolatile memory (NVM) and various volatile registers that may be used to program various capabilities described herein. Control logic 215 may be used to control aspects of the interpolative dividers 217, as explained more fully herein.

Having the capability to vary the frequency provides various advantages. For example, pseudo-synchronous data systems use large FIFOs to keep up with parts per million (ppm) variations in the line rate and the internal clock rate. Frequency partitioning uses a clock source that can be moved up or down in frequency and phase. Frequency partitioning creates a system frequency map with separate frequency domains. Coarse grading of products can be made based on frequency, either for cost or reliability purposes. Frequency margining provides finer grading that can be used for reliability purposes. Board reliability and qualification can utilize frequency and phase adjustments for testing purposes. Debug can utilize a frequency agile clock source to help pinpoint the source of a problem. Thus, having a frequency agile clock source can be useful in multiple ways.

Figure 6:
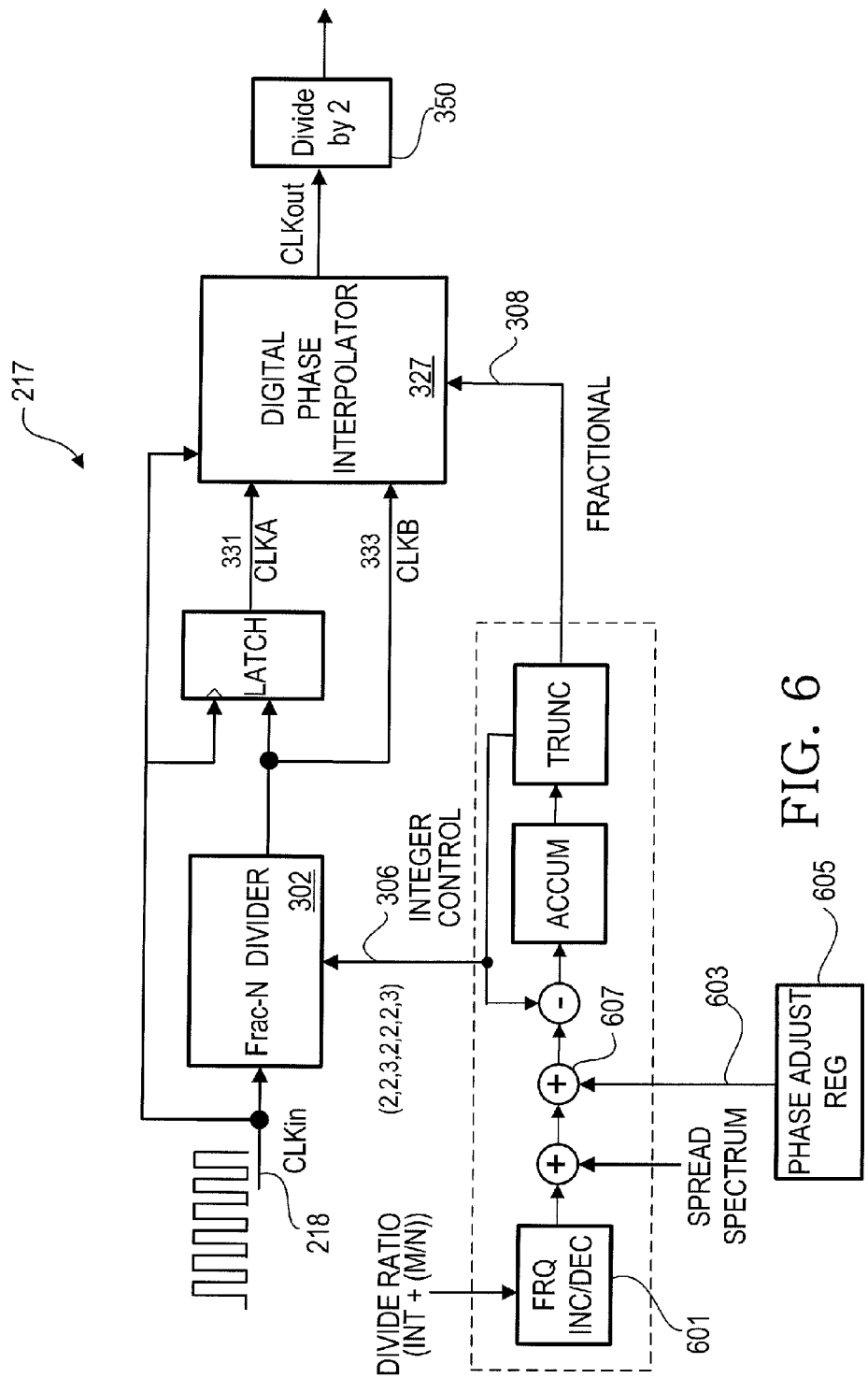
FIG. 6 illustrates a block diagram of an embodiment of the invention that can adjust phase and/or frequency.

Referring now to FIG. 6, shown is a block diagram of an exemplary interpolative divider circuit 217 that includes frequency increment/decrement control logic 601. One way to implement frequency increment/decrement is to adjust the supplied divide ratio (INT+M/N) in frequency increment/decrement control logic 601. In an embodiment, a linear frequency change is provided over a programmable number of steps. In order to accomplish that, in an embodiment, the divide ratio (I+M/N) utilized by the delta sigma modulator has to be changed for each step as described further herein. In an embodiment, frequency increment/decrement block 601 implements a state machine and computational circuits to determine the changed divide ratio. Various approaches to determining the changed divide ratio are described further herein.

Figure 7:
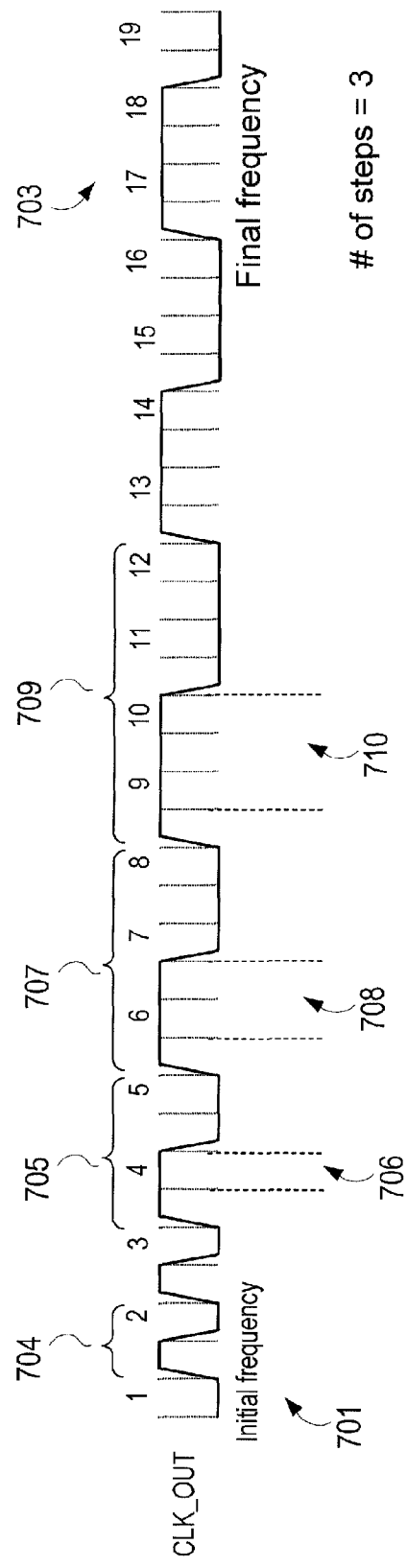
FIG. 7 shows waveforms illustrating operation of frequency increment/decrement according to an embodiment of the invention.

One capability provided in an embodiment of the invention is a digitally controlled transition from one frequency to another in a programmable number of steps. Referring to FIG. 7, a timing diagram illustrates an exemplary change of frequency from the initial frequency shown at 701 to the final frequency shown at 703. In the example shown in FIG. 7, the frequency is changing by half the period of the initial frequency. In an embodiment, the step size is determined by the total frequency change requested and the number of steps requested. As shown in FIG. 7 at each clock period 705, 707, and 709, a frequency change occurs to increase the length of the clock period and thereby slow the frequency. However, one problem with the embodiment illustrated in FIG. 7 is as follows. Assume that the period shown in 704 is 2T (initial period), 705 is 4T, 707 is 6T, and 709 is 8T (final period). Assuming the T=1 microsecond, the beginning frequency at 704 is 500 KHz, at 705 is 250 KHz, at 707 is 166.7 KHz, and at 709 is 125 KHz. While the frequency adjustment is made in three steps in three consecutive clock periods, the frequency change is not linear. Instead, the period is changing linearly by adding a delta of two half periods at 705 (one on the positive cycle and one on the negative) at each output clock cycle. Thus, the period change is linear but the frequency change is not. While that may be satisfactory in some applications, linear frequency change may be preferred in others. Accordingly, in an embodiment, a different change in period is determined for each output clock period so a linear frequency change can occur.

Figure 8:
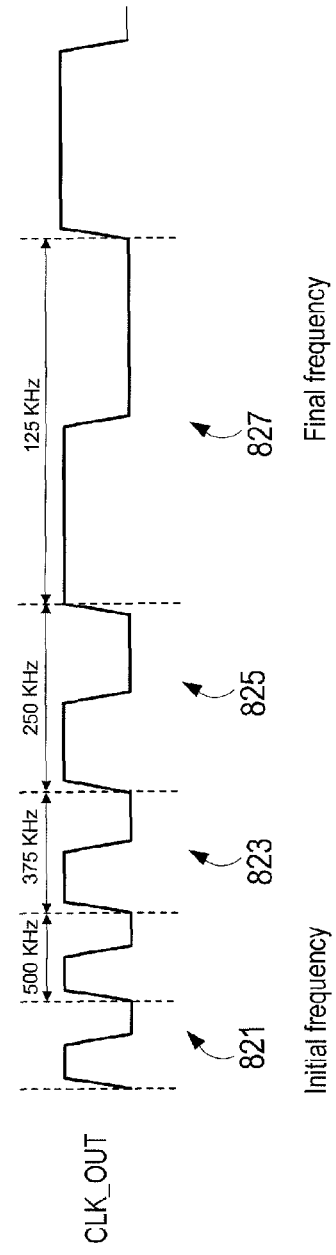
FIG. 8 shows waveforms illustrating operation of frequency increment/decrement according to an embodiment of the invention in which linear frequency adjustment is provided.

Referring to FIG. 8, assume a change from 500 KHz to 125 KHz in three steps. For a linear frequency change over three steps, a change of 125 KHZ is made in each successive period. The initial frequency is shown at 821 at 500 KHz (a period of 2 microseconds). At 823, a frequency of 375 KHz is provided (a period of approximately 2.67 microseconds). At 825, the output clock has a frequency of 250 KHz (a period of 4 microseconds). Finally, at 827, the final frequency of 125 KHz is provided (a period of 8 microseconds). Thus, a linear frequency change is provided. Note that the linearity of the frequency change may be affected by the amount of error in the calculation of the period. That error will be determined, at least in part, by the number of bits utilized to determine the new frequency. That error may range, from e.g., tens of Hz to hundreds of Hz depending on the particular implementation. Thus, assuming, for example, a 100 Hz error and a frequency increment of 100 KHz, the error is sufficiently small to ensure a substantially linear frequency change. A smaller error provides more linearity while larger errors allow more variation in the output clock signal in terms of frequency at each step. Note that while the frequency change is provided with a frequency step of 125 KHz per output clock period in the illustrated embodiment, other embodiments can provide frequency steps of e.g., 100 Hz to 1 MHz. Other embodiments may provide still other frequency capability.

Figure 9:
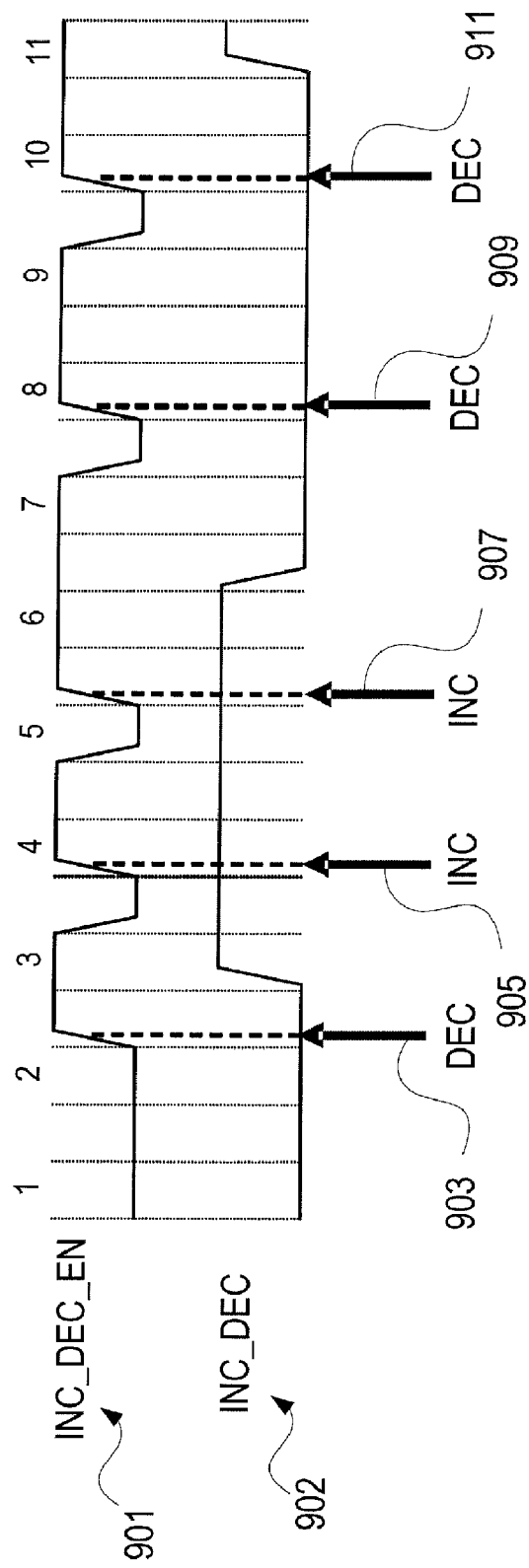
FIG. 9 illustrates use of control signals for frequency increment/decrement according to an embodiment of the invention.

Referring to FIG. 9, in an embodiment two control signals are utilized for the frequency increment/decrement function. In an embodiment, the control signals 901 and 902 (FIG. 9) are provided on input signal lines 230 (see FIG. 2). As shown in FIG. 9, when INC_DEC_EN 901 transitions to 1 at 903, the low value on INC_DEC 902 indicates a frequency decrement. Similarly, at 905, the transition with INC_DEC 902 at a high value indicates a frequency increment. Thus, frequency increments occur at 907 and frequency decrements occur at 909 and 911. An internal control register programmable via communications interface 233 may be used to determine whether the terminals 901 and 902 should be used for frequency increment/decrement control. In embodiments, the frequency step size may be programmable. Step size, as used herein, refers to the frequency change made in each step. Thus, the total frequency change equals the (frequency step size)× (number of steps). In some embodiments, the number of steps in which to change the frequency may be programmable. In an embodiment, the frequency step size may vary from 100 Hz to 10 MHz. Of course, other step sizes may be used. In an embodiment, the number of steps is programmable over the serial communications interface. The number of steps may be written to a register located in control logic 215. In an embodiment of the invention, the number of steps may be programmable up to 512 steps. Other embodiments may utilize a different number of programmable steps. A separate programmable register may be provided for each output clock signal to specify the total frequency change desired for each output clock signal. Thus, for example, referring again to FIG. 8, a total frequency change of 375 KHz may be specified (from 500 KHz to 125 KHz) and three steps. Other embodiments may specify the frequency change by supplying the desired end frequency. The total frequency change may be determined by subtracting the desired end frequency from the current frequency. By programming the frequency change (e.g., by specifying the target frequency) and the number of steps, the frequency increment at each step (also referred to herein as step size) can be internally calculated in the control logic 215. In other embodiments, the frequency increment or step size and the number of steps can be specified and the final frequency does not have to be specified. For example, one could program a 1 KHz frequency increment (step size) and 1 steps to achieve a 1 MHz change. Alternatively, one could program the target frequency and the frequency increment and the number of steps can be calculated internally.

Referring again to FIG. 2, note that there are multiple outputs. In an embodiment, a separate frequency increment/decrement control bit may exist to separately enable frequency increment/decrement for each output clock. Thus, a frequency change to one of the outputs does not necessarily affect the other outputs. On the other hand, each clock output can be configured to have its frequency increment/decrement register control bit enabled so the output clock responds to the control input terminals described in FIG. 9. In some embodiments, separate control signals, e.g., 901 and 902, are provided for all clock outputs, while other embodiments utilize separate control signals for each clock output.

Once a frequency increment or decrement control signal is received over the control terminals as shown in FIG. 9, the appropriate output clock signal will transition from its initial frequency to its target frequency in the programmable number of steps. In an embodiment, the frequency increment/decrement capability is provided over an entire frequency range of the device 200, e.g., from 5 MHz to 350 MHz. Thus, one could specify a 300 MHz frequency change from 5 MHz to 305 MHz in 100 steps. The frequency increment or step size would be 3 MHz. In addition to a wide range, the frequency increment/decrement capability is provided while still providing very accurate clock outputs, e.g., an output frequency error on the order of 1 part per million (PPM). This feature is useful in applications that require a continuously variable clock frequency. This capability can also be used in testing the frequency margin of designs in various test environments. While pin control is provided on some embodiments, other embodiments may rely instead on a frequency increment/decrement command received over the serial communications interface instructing the device to begin the specified frequency change from the beginning frequency to the target frequency over the specified number of steps. Some embodiments may rely on pin control, serial communications I/F control, and some embodiments may allow either approach to be utilized.

In an embodiment, the output frequency changes for each successive output clock period. In other embodiments, the output frequency may change only in response to a command. Thus, e.g., referring to FIG. 9, in order to change a beginning frequency to a target frequency, the increment/decrement (INC_DEC) command is provided using the two control terminals or the serial communications interface, the number of times required to achieve the frequency change desired. Thus, if the frequency change is to take 10 steps, 10 INC_DEC frequency control signals must be received over the INC_DEC and INC_DEC_EN control terminals.

In order to achieve a linear frequency change with an accurate output clock, as discussed with relation to FIG. 8, the divide ratio (INT+M/N) changes for each change of frequency. The term linear frequency change refers to equal, or substantially equal increments or decrements for each step. The output clock frequency (Fout) from the interpolative divider is defined by a divide ratio that divides down the VCO clock frequency (Fvco) supplied from VCO 207 (FIG. 6):

$$Fout = \frac{Fvco}{(I + M/N)},$$

where I, M and N are integers.

To change the output clock frequency by a frequency increment or decrement Fdelta, (Fdelta>0:inc; Fdelta<0: dec):

$$Fout + Fdelta = \frac{Fvco}{(I + M/N + dI + dM/dN)},$$

where dI, dM and dN are integers and dN>dM and $$dI + dM/dN = \frac{-(I + M/N) \times Fdelta}{(Fout + Fdelta)}.$$

If one directly computes (I+M/N+dI+dM/dN)=I'+M'/N', then, $$I' + M'/N' = \frac{(I + M/N) * Fout}{(Fout + Fdelta)}.$$

Or alternatively, $$I' + M'/N' = \frac{I + (M - I*N*Fdelta/Fout)*Fout}{(N + N*Fdelta/Fout)}$$

$$= I + (M - dM'/N + dN'),$$

$$dM' = I*N*Fdelta/Fout, \text{ and}$$

$$dN' = N*Fdelta/Fout.$$

Note that all the multiplications with Fdelta can be implemented as an accumulation of each Fstepsize.

There are several approaches that may be implemented in frequency increment/decrement control logic 601 that can be used to increment/decrement the output clock frequency by Fstepsize each period of the output clock. A first method computes dI, dM and dN, then adds it back to the original divide ratio to get the final divide ratio. The following illustrates operation of the first approach.

```
//The precomputed constants are:
DenInit = N * Fout;    //initial denominator
DenStep = N * Fstepsize;   //
NumStep = (I*N+M) * Fstepsize
//Then dI+dM/dN is calculated for each step:
Numerator: Num <= Num + NumStep * (UP ? -1 : 1)
Denominator: Den <= Den + DenStep * (UP ? 1 : -1)
Initial condition: Num = 0, Den = DenInit
dI = floor ( Num / Den )
dM = remainder (Num/Den)
dN = Den
```

A second approach computes the final divide ratio for each step. The following illustrates operation of the second approach:

```
//The precomputed constants are:
DenInit = N * Fout;
DenStep = N * Fstepsize;
Num = (I*N+M) * Fout;
//For each step, calculate the new I'+M'/N'
Denominator: Den <= Den + DenStep * (UP ? 1 : -1) ;
Initial condition: Den = DenInit;
```

```
N' = Den
I' = floor ( Num/N' );
M' = remainder (Num/N');
```

Note that the updated numerator and denominator are stored for use in the next calculation.

A third approach computes I, M, N such that the frequency step is identical at any time. While providing linearity, any initial frequency step error can accumulate.

```
//The precomputed constants are:
dN    = N * Fstepsize / Fout
dMInit = I * dN
//Calculate I'+M'/N' for each step:
Denominator: N' <= N' + dN * (UP ? 1 : -1);
Numerator: MTemp <= M' - dM * (UP ? 1 : -1);
Initial condition: dM = dMInit, N' = N, M' = M, I' = I;
dI = floor ( MTemp / N' );
I' = I + dI;
M' = MTemp mod N';
dM = dM + dI * dN;
```

Figure 10A:
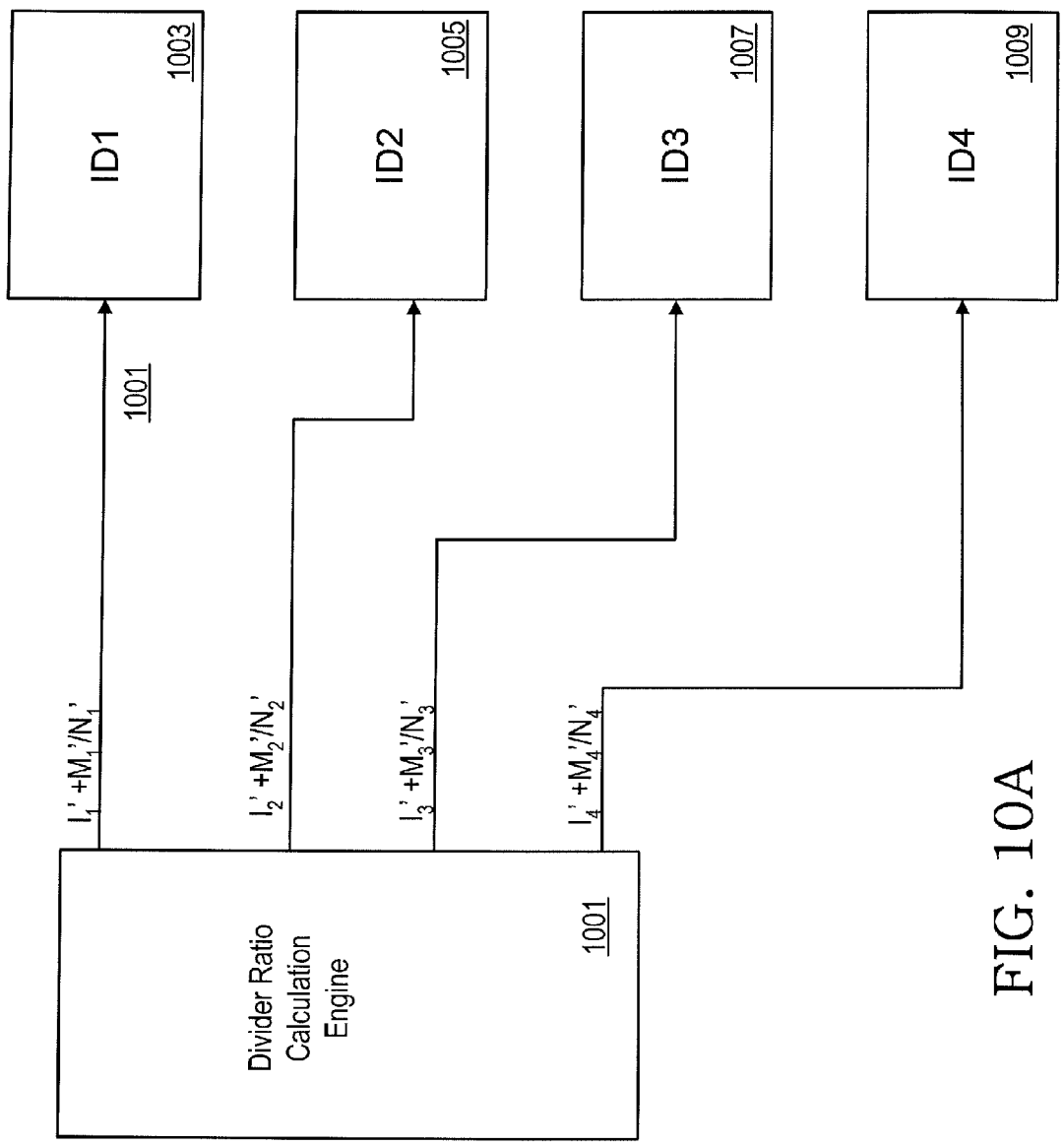
FIG. 10A illustrates a block diagram of a control structure for controlling frequency adjustments for multiple interpolative dividers according to an embodiment of the invention.

Thus, multiple approaches can be taken to computing the new divide ratio for each step. Each step may be computed for each clock period of the output clock. In other embodiments, a step may defined by asserting one or more control terminals (or a communications interface receives a command) to adjust the frequency in embodiments where a separate "command" is required for each step. The various approaches described above can be implemented in e.g., state machines and arithmetic logic (appropriate adders, dividers, and other arithmetic circuits determined by the particular approach) in control logic 215 (FIG. 2) or block 601 (FIG. 6). Various constants may be computed and stored in registers in control logic 215. Referring to FIG. 10A, note that because there are multiple devices, a single control block 1001 may be utilized to update the values of INT+M/N for each of the interpolative dividers 1003-1009. Alternatively, separate control logic 601, as in FIG. 6, may be utilized for each interpolative divider.

Figure 10B:
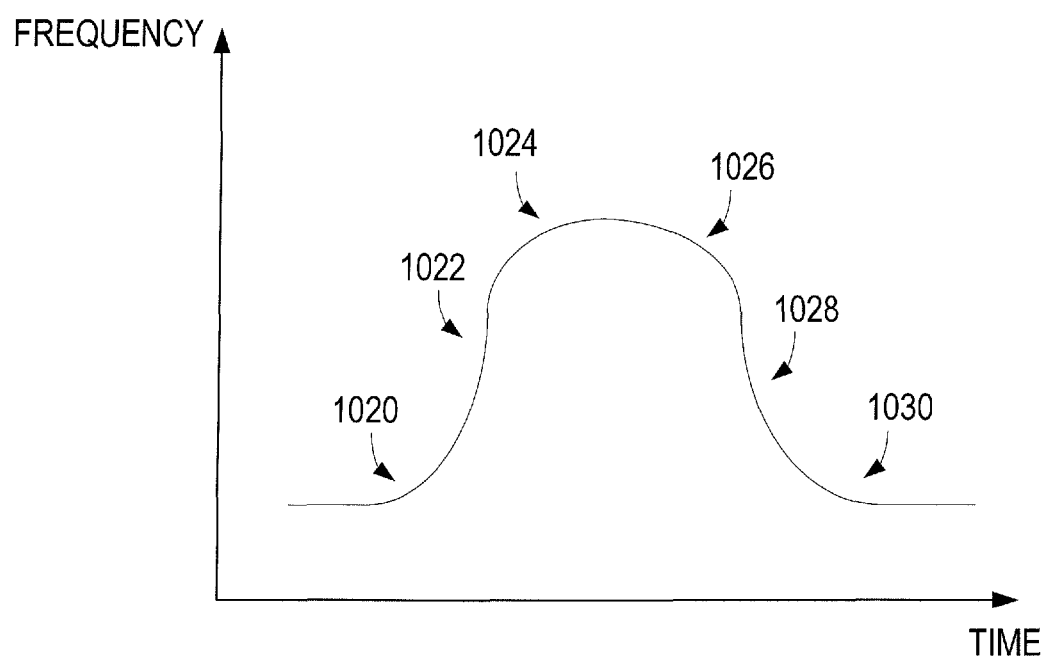
FIG. 10B illustrates a bell-shaped frequency spectrum that may be achieved in one or more embodiments of the invention.

While some embodiments and applications utilize linear frequency changes, other embodiments may utilize non-linear frequency changes. For example, in an embodiment, the frequency change can be different at any or all steps. Thus, a wide variety of frequency spectrums can be provided. Referring to FIG. 10B, a bell shaped frequency spectrum can be generated by using the appropriate increment and decrement signals and the appropriate frequency change amount. That shape may be implemented by starting with a small frequency increment at 1020, increasing the frequency increment at 1022, and reducing the frequency increment at 1024. Similarly a small frequency decrement occurs at 1026, a larger frequency decrement at 1028, and the frequency decrement slows again at 1030. The smoothness of the bell shape may be determined by the number and granularity of the different frequency increments and decrements utilized to achieve the shape.

Figure 10C:
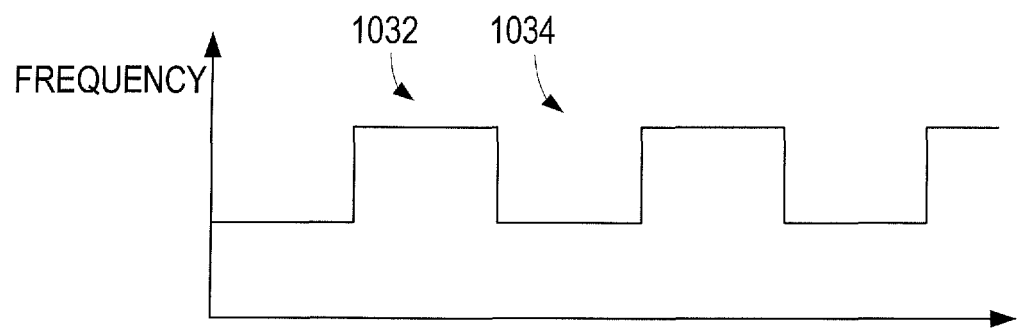
FIG. 10C illustrates frequency changes that may be utilized to provide modulation for slow speed communications in one more embodiments of the invention.

In another application, frequency changes such as shown in FIG. 10C may be utilized to provide modulation for slow speed communications such as a frequency shift keying, in which data is encoded by using different frequencies, e.g., at 1032 and 1034. As can be seen, the frequency change capability of embodiments described herein can be used in a number of different ways. Note that the frequency increment and decrement can be achieved across a wide frequency range without changing the VCO (or other clock source) frequency. If a PLL is used to provide the input frequency 218 (see FIG. 3), note that the frequency changes are independent of the loop bandwidth.

Referring back to FIG. 6, in an embodiment, phase adjust (phase increment or decrement) of an output clock signal from an interpolative divider is provided by supplying a phase adjust amount from phase adjust register 605 (or other storage location) on signal line 603 to summing circuit 607, which is added to the divide ratio. Note that the particular location of the summing circuit is not critical. It is shown as a separate summing circuit in FIG. 6 for clarity. It may, in fact, be combined with the divide ratio outside of the interpolative divider circuit. If the phase adjust value is supplied only during a single output clock period, it will only affect one clock period.

Phase increment/decrement control may be provided from the serial communications interface 233 or provided by external pin control in the same manner as for frequency adjust. However, the phase offset can be constant over a number of steps if more than one step is utilized to adjust the phase. Thus, once the phase adjust amount is specified, e.g., by writing the value to the communications interface, along with the number of steps, the value corresponding to the phase adjust amount can be loaded into register 605 and supplied, e.g., over signal lines 603 from register 605 to summing circuit 607. While a one-time phase offset capability may be provided in some embodiments allowing a phase offset to be accomplished in a single step in response to a command, in other embodiments the phase offset can be accomplished in multiple steps in response to a single command. The phase offset can be linear since the change in period can be the same for each clock cycle in such an embodiment. For example, a total phase offset, e.g., 100 ns, along with a number of steps, e.g., 100 steps, may be specified over communications interface 233. The command to adjust phase, either from one or more control terminals or over the serial communications interface, starts a sequence that changes 1 ns each step by supplying the value corresponding to 1 ns over 603 for 100 consecutive cycles. In another embodiment, a phase step size (e.g., 1 ns) for each step may be specified, along with the number of steps (e.g. 100), over the communications interface 233. Alternatively, the total phase change may be specified (e.g. 100 ns) with a phase step size (1 ns). The number of steps can be determined in the control logic 215. The control terminals shown in FIG. 9 can work identically in a phase change environment. That is, a phase increment/decrement is indicated the same as a frequency increment/decrement. A control register in control logic 215 may be programmed to determine whether the control terminals are used for frequency or phase increment/decrement or neither. Of course, separate pins can be provided for phase and frequency adjust. Further, separate phase adjust pins can be provided for each interpolative divider supplying an output clock. In an embodiment, the phase adjust amount remains loadable into register 605 once programmed. The pins may be used to accomplish a phase adjust as follows. Assume an embodiment in which the phase adjust is provided once in response to the appropriate control signals. Assume that the phase adjust amount is 1 ns. Every time an increment or decrement is indicated on pins 901 and 902, a 1 ns phase adjust is provided. Asserting the increment/decrement pin 902 100 times while the increment/decrement enable pin 901 is asserted, allows a 100 ns phase shift to be accomplished.

Figure 11A:
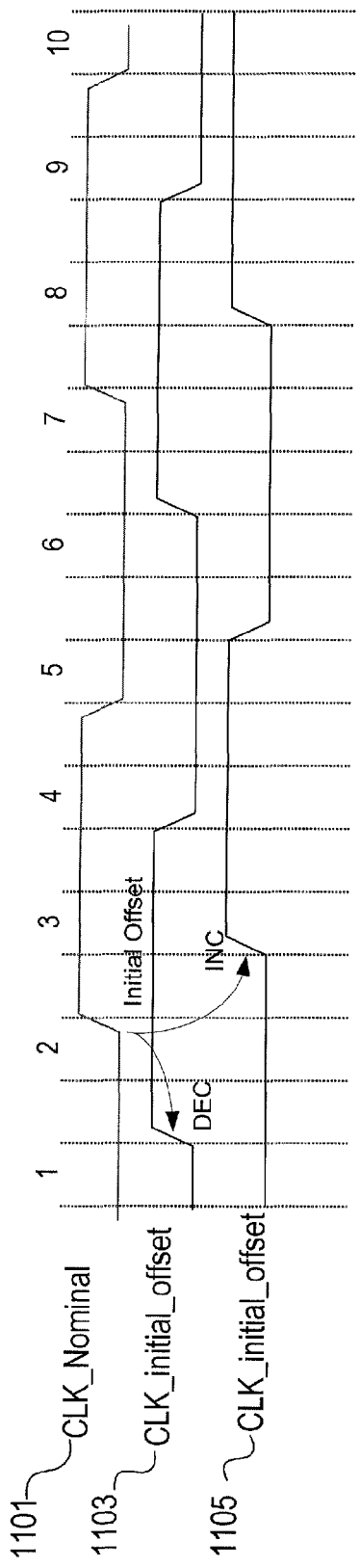
FIG. 11A illustrates an embodiment of the invention having an initial programmable phase offset.

In addition to specifying a phase change during the course of operation, an initial phase offset on startup may also be provided, as shown in FIG. 11A. Initial phase offset can provide several advantages. For example, in board design, in order to compensate, e.g., for trace mismatches on the board, a start-up phase offset for each output clock can be specified. Thus, one or more programmable register(s) in control logic 215 can be used to specify a start-up phase offset of a predetermined amount for each interpolative divider. For example, a register 605 can be located in control logic 215 for each of the output clocks. In one embodiment, that start-up phase offset is up to ±45 nanoseconds in 10 picosecond increments. Thus, for example, referring to FIG. 11A, clock 1101 is the clock assuming no initial phase adjust. An initial phase offset, depending on the polarity can result in clock 1103 or clock 1105 with an initial phase offset.

Figure 11B:
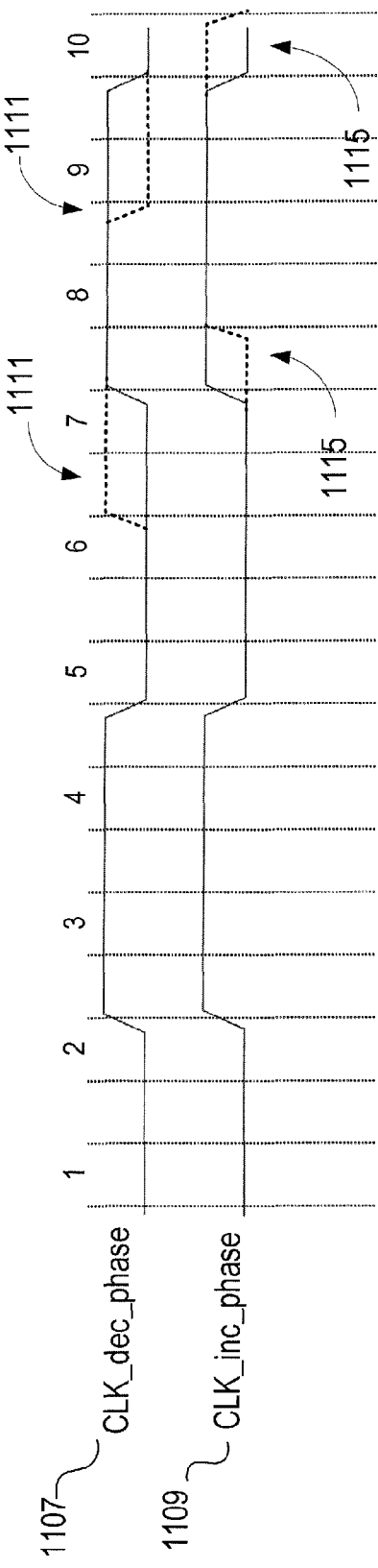
FIG. 11B illustrates incrementing or decrementing phase.

In addition to initial phase offset shown in FIG. 11A, the offset approach described with relation to FIG. 6, can result in a phase advance or a phase delay during regular operation of the clock as shown in FIG. 11B. For clock 1107, a phase decrement occurs at 1111. For clock 1109, a phase increment occurs at phase 1115. The polarity and magnitude of the phase change depends on the value loaded into register 605.

Figure 12:
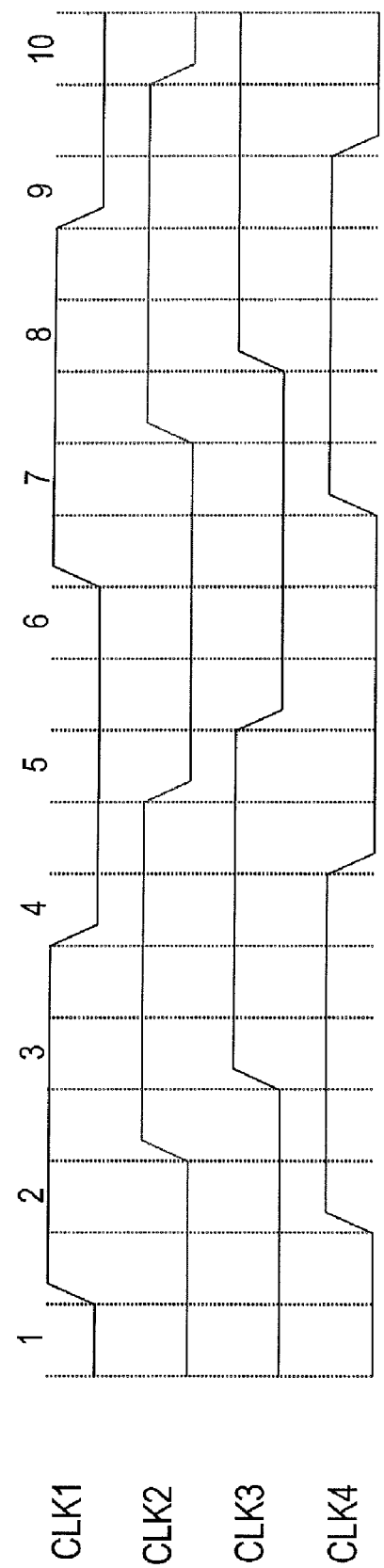
FIG. 12 illustrates a timing diagram showing how phase offsets can be specified separately for different clock outputs.

Embodiments described herein have the capability of generating multiple clock signals with arbitrary phase/frequency relationships from a single phase-locked loop. With multiple clocks being output, an advantage is to have each of the clocks have an initial phase that is different. That can be accomplished by having the phase adjust register 605 (see FIG. 6) have an appropriate positive or negative value. Thus, as shown in FIG. 12, clocks 1-4 can start with the initial phases offset from each other as shown. An initial phase offset can be stored in NVM for use at startup on power on. Alternatively, the initial phase offsets can be loaded after power on through the communications interface, assuming a separate enable command or signal can be used to start the clock outputs.

The description of the invention set forth herein is illustrative, and is not intended to limit the scope of the invention as set forth in the following claims. Variations and modifications of the embodiments disclosed herein may be made based on the description set forth herein, without departing from the scope of the invention as set forth in the following claims.

What is claimed is:

1. A method for adjusting a frequency of a generated signal comprising:
    in response to a request to adjust the frequency of the generated signal in a programmable number of steps, adjusting the frequency from a beginning frequency to an ending frequency in the number of steps;
    wherein each step of the number of steps is realized in one cycle of the generated signal;
    wherein the frequency is adjusted such that each frequency change is substantially equal at each step; and
    wherein the frequency of the generated signal is adjusted for each step by a calculated frequency increment or decrement based on a total frequency adjustment from the beginning frequency to the ending frequency and the number of steps.

2. The method as recited in claim 1 further comprising adjusting a divide ratio to generate an adjusted divide ratio at each step to maintain the frequency increment or decrement substantially equal for each step, and supplying an integer portion of each adjusted divide ratio to control a divider circuit and supplying a fractional portion of each adjusted divide ratio to a phase interpolator to adjust an output of the divider circuit.

3. The method as recited in claim 1 further comprising adjusting the frequency in the number of steps in response to at least a first control signal received on a first input terminal of a device generating the signal.

4. The method as recited in claim 3 further comprising incrementing the frequency in response to assertion of the first control signal if a second control signal is at a first value and decrementing the frequency in response to the assertion of the first control signal if the second control signal received at a second input terminal of the device is at a second value.

5. The method as recited in claim 1 further comprising adjusting the frequency in the number of steps in response to a command received over a serial communications interface.

6. The method as recited in claim 1 further comprising receiving a communication over a communications interface specifying at least one of the number of steps and the total frequency adjustment from the beginning frequency to the ending frequency.

7. The method as recited in claim 1 further comprising adjusting a divide ratio to generate an adjusted divide ratio at each step to maintain the frequency increment or decrement substantially equal for each step.

8. An apparatus comprising:
a fractional-N divider configured to receive an input signal and supply a divided signal divided in accordance with an integer divide control signal based on a supplied divide ratio;
a phase interpolator coupled to the fractional-N divider to adjust a phase of the divided signal according to a fractional portion of the supplied divide ratio and to supply a generated signal;
wherein the apparatus, responsive to a request for a frequency adjustment of the generated signal in a programmable number of steps, is configured to adjust the frequency of the generated signal from a beginning frequency to an ending frequency in the programmable number of steps by adjusting the supplied divide ratio at each step; and
control logic configured to adjust the frequency of the generated signal in a substantially equal increments over the number of steps;
wherein the control logic is configured to calculate a frequency increment or decrement for each step based on a total frequency adjustment from the beginning frequency to the ending frequency and based on the number of steps, the generated signal being adjusted by the frequency increment at each step.

9. The apparatus as recited in claim 8 wherein each step of the programmable number of steps is realized in one period of the generated signal.

10. The apparatus as recited in claim 8 wherein the control logic is configured to adjust the divide ratio that includes the integer portion and the fractional portion, to maintain the frequency increment or decrement substantially equal for each step.

11. The apparatus as recited in claim 8 further comprising a first input terminal for receiving a first control signal and a second input terminal for receiving a second control signal, the control logic responsive to the first control signal being asserted to increment or decrement the frequency of the generated signal according to a value of the second control signal.

12. The apparatus as recited in claim 8 further comprising a communications interface and wherein the control logic is responsive to a command received over the communications interface to adjust the frequency in the programmable number of steps.

13. The apparatus as recited in claim 8 further comprising:
a communications interface configured to receive a communication from external to the apparatus; and
a step storage location coupled to the communications interface to store the number of steps specified in the communication received over the communications interface.

14. The apparatus as recited in claim 8 further comprising:
a communications interface configured to receive a communication from external to the apparatus; and
a storage location coupled to the communications interface to store the frequency adjustment specified in the communication received over the communications interface.

15. The apparatus as recited in claim 8 wherein the apparatus has an output frequency range from a lowest frequency to a highest frequency and the apparatus is operable to adjust the generated signal over the output frequency range in substantially equal frequency steps.

16. An apparatus comprising:
a synthesizer circuit coupled to receive an input signal and supply a generated signal in accordance with a divide ratio;
wherein the apparatus, responsive to a request for a frequency adjustment of the generated signal in a programmable number of steps, is configured to adjust the frequency of the generated signal from a beginning frequency to an ending frequency in the programmable number of steps by adjusting the divide ratio at each step; and
control logic configured to adjust the frequency of the generated signal in substantially equal increments over the number of steps, wherein the control logic is configured to calculate a frequency change for each step based on a total frequency adjustment from the beginning frequency to the ending frequency and based on the number of steps, the generated signal being adjusted by the frequency increment at each step, wherein each step of the programmable number of steps is realized in one period of the generated signal.

17. The apparatus as recited in claim 16 wherein the control logic is configured to adjust the divide ratio that includes an integer portion and a fractional portion, to maintain the frequency increment or decrement substantially equal for each step.

18. The apparatus as recited in claim 16 further comprising a first input terminal for receiving a first control signal and a second input terminal for receiving a second control signal, the control logic responsive to the first control signal being asserted to increment or decrement the frequency of the generated signal according to a value of the second control signal.

19. The apparatus as recited in claim 16 further comprising a communications interface and wherein the control logic is responsive to a command received over the communications interface to adjust the frequency in the programmable number of steps.

20. The apparatus as recited in claim 16 further comprising:
a communications interface configured to receive a communication from external to the apparatus;
a step storage location coupled to the communications interface to store the number of steps specified in the communication received over the communications interface; and
a frequency adjustment storage location coupled to the communications interface to store the frequency adjustment specified in the communication received over the communications interface.

* * * * *

UNITED STATES PATENT AND TRADEMARK OFFICE
CERTIFICATE OF CORRECTION

Page 1 of 1

| | |
|---|---|
| PATENT NO. | : 7,800,451 B2 |
| APPLICATION NO. | : 12/236042 |
| DATED | : September 21, 2010 |
| INVENTOR(S) | : Zhuo Fu et al. |

It is certified that error appears in the above-identified patent and that said Letters Patent is hereby corrected as shown below:

Col. 13, line 36, please delete the "a" before "substantially"

Signed and Sealed this
Fifteenth Day of November, 2011

David J. Kappos
*Director of the United States Patent and Trademark Office*